United States Patent [19]
Chun

[11] Patent Number: 5,084,686
[45] Date of Patent: Jan. 28, 1992

[54] PHASE SPLITTER

[75] Inventor: Byung-jin Chun, Suwon, Rep. of Korea

[73] Assignee: Samsung Electronics Co., Ltd., Suwon, Rep. of Korea

[21] Appl. No.: 636,120

[22] Filed: Dec. 31, 1990

[30] Foreign Application Priority Data

Dec. 29, 1989 [KR] Rep. of Korea .................. 89-20077

[51] Int. Cl.⁵ .............................................. H03H 7/18
[52] U.S. Cl. ...................................... 333/138; 333/164; 333/103
[58] Field of Search ............... 333/139, 138, 164, 100, 333/101, 103, 124, 140, 132, 156, 161; 307/242, 248

[56] References Cited

U.S. PATENT DOCUMENTS 5,045,822  9/1991  Mohwinkel .................. 333/100 X

Primary Examiner—Eugene R. Laroche
Assistant Examiner—Ali Neyzari
Attorney, Agent, or Firm—Cushman, Darby & Cushman

[57] ABSTRACT

Disclosed is a 90-degree phase splitter utilized in QPSK modulator and demodulator. The 90-degree phase splitter uses a transistor thereby converting a voltage source into a current source, and accordingly obtains two outputs having same in magnitude but different in phase by 90 degrees through output circuits comprising reactors and resistors.

6 Claims, 3 Drawing Sheets

PHASE SPLITTER

BACKGROUND OF THE INVENTION

The present invention relates to a phase splitter which is utilized in a modulator and a demodulator of QPSK(=Quadrature Phase Shift Keying), and more particularly to a 90 degrees phase splitter for splitting a phase by converting a voltage source to be phase-shifted into a current source.

Generally, the same 90 degrees phase splitters are used in the QPSK modulator and demodulator.

Conventionally, as shown in FIG. 1, a signal outputted from a voltage source $V_s$ passes through resistors $R_1$ and $R_2$, and capacitors $C_1$ and $C_2$.

Then, a first and a second output voltages $V_1$ and $V_2$ are produced via a first and a second output means.

Here, the first and the second output voltages are represented as follows:

$$V_1 = \frac{\frac{1}{jwC_1}}{R_1 + \frac{1}{jwC_1}} V_s = \frac{1}{1 + jwR_1C_1} V_s \quad (1)$$

$$V_2 = \frac{R_2}{R_2 + \frac{1}{jwC_2}} V_s = \frac{jwR_2C_2}{1 + jwR_2C_2} V_s \quad (2)$$

In the equations (1) and (2), when a relationship of $R_1 = R_2$ [Ω] between the resistors is met, a relationship of $C_1 = C_2$ [farad] between the capacitors is met and a frequency f is equal to $1/2\pi RC$, an angular frequency w meets a relationship of $w = 2\pi f = 1/R_1C_1 = 1/R_2C_2$.

Thus, the equations (1) and (2) are represented as follows:

$$V_1 = \frac{1}{1+j} V_s, \quad V_2 = \frac{j}{1+j} V_s$$

Therefore, a relationship of $V_2 = jV_1$ is formed, accordingly a first and a second output voltages $V_1$ and $V_2$ which have the same magnitudes but differ in phase by 90 degrees each other are obtained. However, in a prior 90 degrees phase splitter using a voltage source, when a value of an inherent impedance of the voltage source is large, it is difficult to perform to phase-split accurately by 90 degrees, as well as when a driving voltage $V_s$ is small, it is pointed out as a defect that each of output voltages of the phase splitter is small.

SUMMARY OF THE INVENTION

It is an object of the present invention to provide a phase splitter for facilitating to phase-split by 90 degrees by converting a driving voltage source into a driving current source, in order to solve the above-mentioned defect.

Therefore, in order to achieve the above-mentioned object, there is provided a phase splitter according to the present invention, comprising a voltage source working as a driving signal source;

a voltage to current converting means for converting the driving voltage source into a driving current source; and a first and a second output means connected in parallel each other which are connected in series to the voltage to current converting means and for outputting output voltages which differ in phase each other but have the same magnitudes.

DETAILED DESCRIPTION OF THE PREFERRED EMBODIMENTS

The preferred embodiments of the present invention will be described below in detail with respect to the accompanying drawings.

Figure 1:
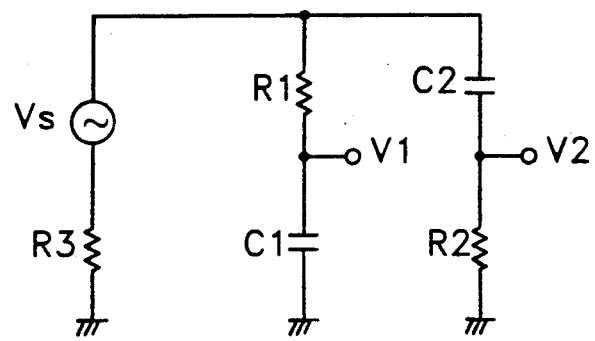
FIG. 1 is a circuit diagram showing a 90° phase splitter of the prior art.
Figure 2:
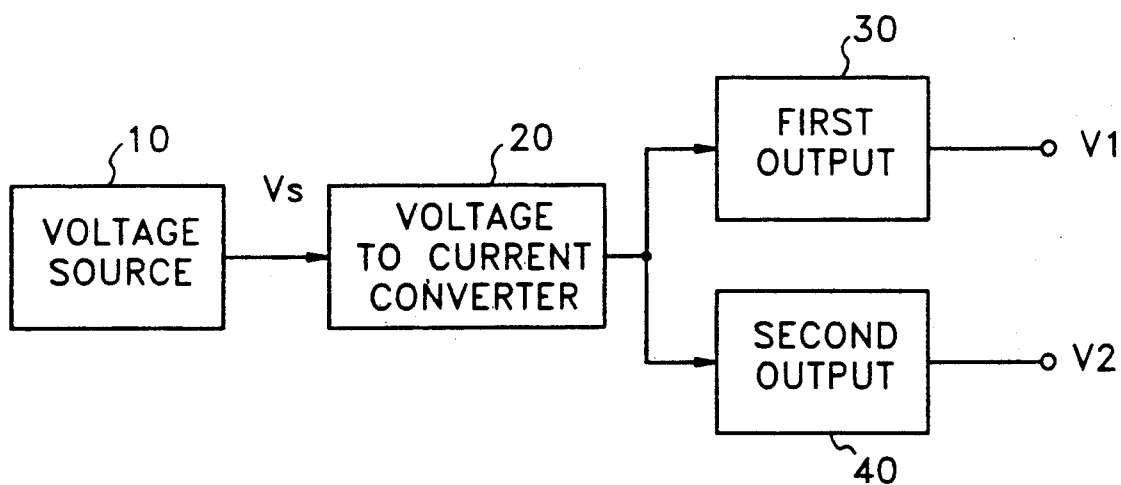
FIG. 2 is a block diagram showing a 90° phase splitter according to the present invention.
Figure 3:
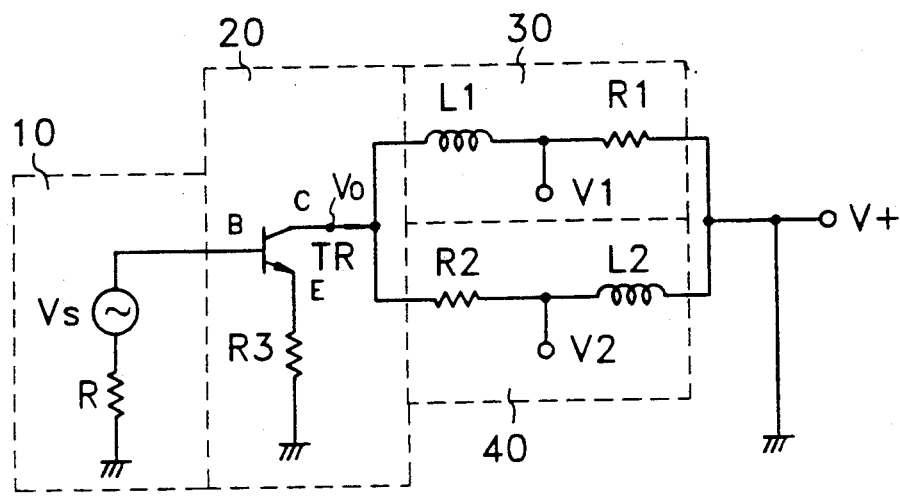
FIG. 3 is a circuit diagram showing an exemplary embodiment of the present invention.

Referring to FIG. 2, a phase splitter according to the present invention comprises a voltage/current converting means 20 for converting a driving voltage Vs outputted from a voltage source 10 working as a driving signal source. The output terminal of this voltage/current converting means 20 is connected to a first and a second output means 30 and 40 for supplying output voltages which have same magnitudes but differ in phase each other. This voltage/current converting means 20 may be composed of a transistor device TR. Referring to FIG. 3, the driving voltage source Vs is connected to a base electrode B of the transistor TR. An emitter electrode of the transistor TR is grounded via a resistor R3. Also, a collector electrode C of the transistor TR is connected in series to a first output means 30 and a second output means 40 which are connected in parallel each other.

The operation of the transistor TR used for the voltage/current converting means 20 will be described below with respect to FIG. 5.

Figure 5:
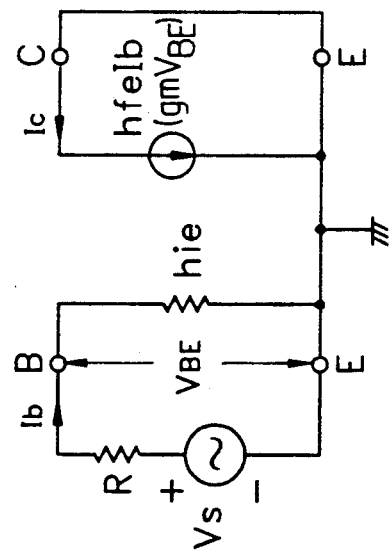
FIG. 5 is an equivalent circuit diagram of the transistor utilized in the present invention.

Referring to FIG. 5 showing an equivalent circuit diagram of the transistor TR, when the voltage source Vs having an inherent impedance R is connected between the base electrode B and the emitter electrode of the transistor TR, the current Ic flowing in the collector electrode C is represented as a base-emitter voltage $V_{BE}$ multiplied by a shot-circuit mutual conductance gm.

That is, a relationship of the following equation (3) is formed.

$$Ic = -gmV_{BE} \quad (3)$$

Thus, the present invention utilizes a transistor TR, thereby obtaining a function that the voltage source Vs is converted into a current source.

Next, as shown in FIG. 3, the collector electrode C of the transistor TR is connected to the first and the second output means 30 and 40.

The first output means 30 is composed of a reactor $L_1$ and a resistor $R_1$ which are connected in series with each other, and the second output means 40 is composed of a resistor $R_2$ and a reactor $L_2$ which are connected in series with each other.

Here, a first output voltage $V_2$ which is outputted through a point between the reactor $L_1$ and the resistor $R_1$, and a second output voltage $V_2$ which is outputted through a point between the resistor $R_2$ and the reactor $L_2$ are represented as follows:

$$V_1 = \frac{jwL_1}{R_1 + jwL_1} V_0 \quad (4)$$

$$V_2 = \frac{R_2}{R_2 + jwL_2} V_0 \quad (5)$$

in which, $V_0$ indicates a voltage of the collector electrode c of the transistor TR.

In the equations (4) and (5), when a frequency f is equal to $1/2\pi \times (Ri/Li)$ (i=1,2), the angular frequency w is equal to $2\pi f = Ri/Li = R_1/L_1 = R_2/L_2$.

Thus, substituting a value of the angular frequency w into the equations (4) and (5), the following relationships of $V_1$ and $V_2$ are obtained.

That is, $$V_1 = \frac{1}{1-j} = \frac{1+j}{2}, \text{ and}$$

$$V_2 = \frac{1}{1+j} = \frac{1-j}{2}$$

are obtained, accordingly the first output voltage $V_1$ and the second output voltage $V_2$ are identical in magnitude and differ in phase by 90 degrees each other. In addition, the phase splitter according to the present invention utilizes an amplifying function of the transistor TR, accordingly even if the small driving voltage Vs is applied to the base electrode of the transistor TR, relatively large output voltages $V_1$ and $V_2$ are obtained.

Figure 4:
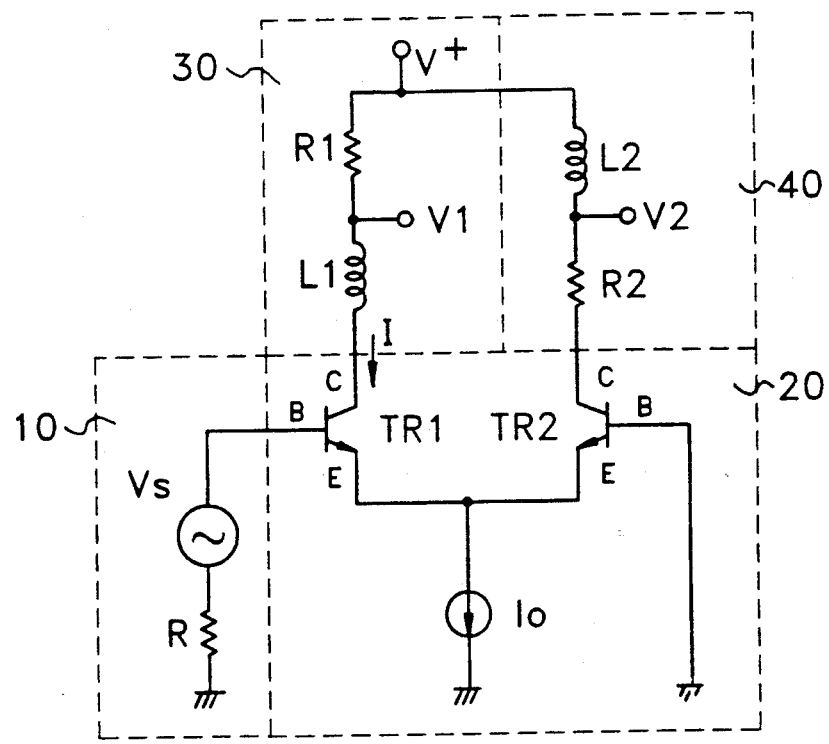
FIG. 4 is a circuit diagram showing another embodiment of the present invention.

On the one hand, FIG. 4 shows a circuit diagram of another embodiment of the present invention.

Referring to FIG. 4, transistors $TR_1$ and $TR_2$ based on the functions of differential amplification are connected to a first output means 30 comprising a resistor $R_1$ and a reactor $L_1$, and a second output means 40 comprising a resistor $R_2$ and a reactor $L_2$, respectively.

Here, the alternate currents flowing in the first and the second output means 30 and 40 comprising a resistor and a reactor, respectively, are identical in magnitude but opposite in phase with each other. When the collector current of the transistor $TR_1$ is I[A], the first and the second output voltages $V_1$ and $V_2$ are represented as follows:

$$V_1 = R_1 I \quad (6)$$

$$V_2 = -jwL_2 I \quad (7)$$

Here, if the relationships of $w = R/L = R_1/L_1 = R_2$, $R_1 = R_2$ and $L_1 = L_2$ are satisfied, the relationship of $V_2 = -jV_1$ is obtained from the equations (6) and (7).

Thus, the first output voltage $V_1$ and the second output voltage $V_2$ are same in magnitude and differ in phase by 90 degrees each other.

At this time, it can be seen that the present invention effects upon an improvement of a common mode rejection ratio through using features of differential amplifiers.

As described above, the present invention utilizes a transistor, thereby converting a voltage source as a driving signal source into a current source outputted from its collector electrode.

Accordingly, the present invention utilizes reactors instead of using capacitors, and obtains a large output voltage with a small driving voltage through an amplification function of transistor.

What is claimed is:

1. A 90-degree phase splitter adapted to a modulator and a demodulator, comprising:
   a voltage source as a driving signal source;
   a voltage/current converting means for converting the driving voltage source into a current source; and
   a first and a second output means connected in parallel with each other which are connected in series to the voltage/current converting means and for outputting output voltages which are same in magnitude and differ in phase by 90 degrees with each other, wherein said voltage/current converting means is composed of a transistor element, said driving voltage source being connected to a base electrode of the transistor element, said first and second output means being connected to a collector electrode of the transistor element, and an emitter electrode of the transistor element being grounded.

2. A 90 degrees phase splitter as claimed in claim 1, wherein said first output means is composed of a reactor and a resistor which are connected in series in the order of the reactor after the resistor, the first output voltage being outputted from a point between the reactor and the resistor,
   said second output means is composed of a resistor and a reactor which are connected in series in the order of the resistor after the reactor, the second output voltage being outputted from a point between the resistor and the reactor, and
   said first output means and said second output means being connected in parallel with each other.

3. A 90 degrees phase splitter as claimed in claim 2, wherein said reactors have same impedance values, and said resistors have same impedance values.

4. A 90-degree phase splitter adapted to a modulator and a demodulator, comprising:
   a voltage source as a driving signal source;
   a voltage/current converting means for converting the driving voltage source into a current source; and
   a first and a second output means connected in parallel with each other which are connected in series to the voltage/current converting means and for outputting output voltages which are same in magnitude and differ in phase by 90 degrees with each other, wherein said voltage/current converting means is composed of two transistors of which emitter electrodes are common and connected to ground through a predetermined current source and which are connected in parallel with each other, one transistor of which base electrode is connected to the driving voltage source, and collector electrode is connected to the first output means, the other transistor of which base electrode is grounded through a predetermined capacitor, and collector electrode is connected to the second output means.

5. A 90 degrees phase splitter as claimed in claim 3, wherein said first output means is composed of a reactor and a resistor which are connected to a collector electrode of one transistor, in series in the order of the reactor after the resistor, the first output voltage being outputted from a point between the reactor and the resistor, and said second output means is composed of a resistor and a reactor which are connected to a collector electrode of the one transistor, in series in the order of the resistor after the reactor, the second output voltage being outputted from a point between the resistor and the reactor.

6. A 90 degrees phase splitter as claimed in claim 4, wherein said reactors have same impedance values and said resistors have same impedance values.

* * * * *